United States Patent
Drottar et al.

(10) Patent No.: US 7,436,215 B2
(45) Date of Patent: Oct. 14, 2008

(54) TRANSMITTER

(75) Inventors: Ken Drottar, Portland, OR (US); Zale T Schoenborn, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 423 days.

(21) Appl. No.: 10/676,712

(22) Filed: Sep. 30, 2003

(65) Prior Publication Data
US 2005/0069027 A1 Mar. 31, 2005

(51) Int. Cl.
*H03K 19/094* (2006.01)
*H03K 19/0175* (2006.01)
*H03K 19/20* (2006.01)

(52) U.S. Cl. .............................. 326/83; 326/68; 326/87; 326/112; 327/108

(58) Field of Classification Search .................. 326/82, 326/83, 86, 87, 89
See application file for complete search history.

(56) References Cited

U.S. PATENT DOCUMENTS

| | | | | |
|---|---|---|---|---|
| 5,519,344 A | * | 5/1996 | Proebsting | 327/108 |
| 5,864,506 A | * | 1/1999 | Arcoleo et al. | 365/189.05 |
| 6,118,302 A | * | 9/2000 | Turner et al. | 326/68 |
| 6,285,215 B1 | * | 9/2001 | Voshell | 326/86 |
| 6,329,836 B1 | * | 12/2001 | Drost et al. | 326/30 |
| 6,404,239 B1 | * | 6/2002 | Kawahara et al. | 326/121 |
| 6,420,913 B1 | * | 7/2002 | Ang et al. | 327/108 |
| 6,563,343 B1 | * | 5/2003 | Patel et al. | 326/87 |
| 6,614,258 B2 | * | 9/2003 | Song | 326/39 |
| 6,704,818 B1 | * | 3/2004 | Martin et al. | 710/100 |
| 6,794,909 B1 | * | 9/2004 | Urakami et al. | 327/112 |
| 6,876,224 B2 | * | 4/2005 | Marshall et al. | 326/22 |
| 6,894,536 B2 | * | 5/2005 | Martin et al. | 326/63 |
| 7,122,868 B2 | * | 10/2006 | Honda | 257/391 |
| 2002/0084804 A1 | * | 7/2002 | Horiguchi et al. | 326/121 |

OTHER PUBLICATIONS

U.S. Appl. No. 10/848,673, filed May 19, 2004, Pasqualini.

* cited by examiner

*Primary Examiner*—Rexford Barnie
*Assistant Examiner*—Dylan White
(74) *Attorney, Agent, or Firm*—Schwegman, Lundberg & Woessner, P.A.

(57) ABSTRACT

In some embodiments, a transmitter includes a first circuit coupled to an input port of the transmitter, and a second circuit coupled to the first circuit and to an output port of the transmitter, wherein the first circuit is sized with respect to the second circuit such that for a pulse signal applied to the input port, the transmitter generates an output signal having a rise-time and a fall-time that are substantially equal at the output port.

22 Claims, 7 Drawing Sheets

TRANSMITTER

FIELD

This invention relates to circuits. More particularly, this invention relates to transmitter circuits.

BACKGROUND

Transmitter circuits are used in computer systems and integrated circuits that transmit information over transmission lines. Many transmitter circuit designs have been developed. Some transmitter circuits were developed for high speed data transmission. Other transmitter circuits were developed for low speed transmission. Unfortunately, many of these transmitter circuits designs, both those developed for high speed data transmission and those developed for low speed data transmission, are complex, large, noisy, and can consume power even when not transmitting information.

DESCRIPTION

Figure 1:
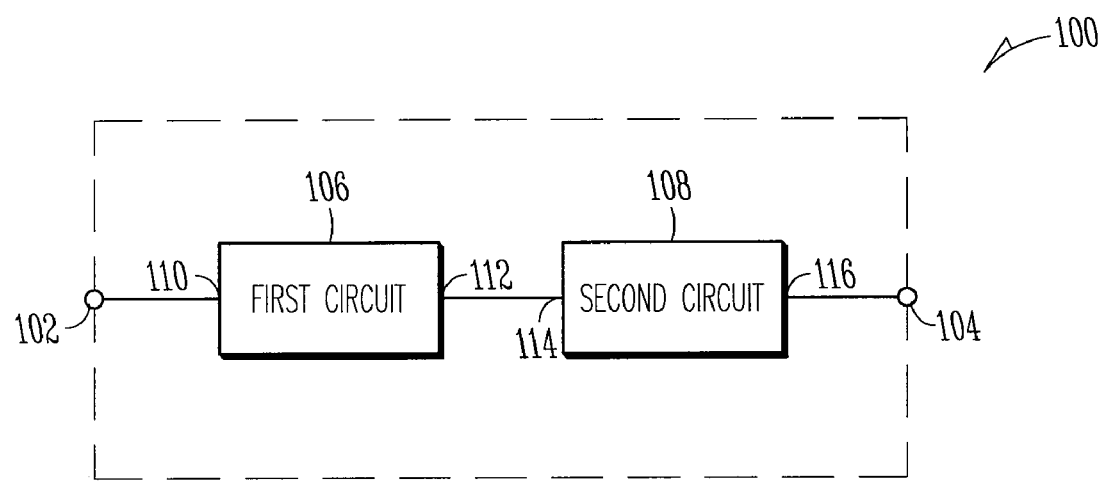
FIG. 1 is a block diagram of a transmitter in accordance with some embodiments of the present invention.

In the following description of some embodiments of the present invention, reference is made to the accompanying drawings which form a part hereof, and in which are shown, by way of illustration, specific embodiments of the present invention which may be practiced. In the drawings, like numerals describe substantially similar components throughout the several views. These embodiments are described in sufficient detail to enable those skilled in the art to practice the present invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1 is a block diagram of a transmitter 100 in accordance with some embodiments of the present invention. The transmitter 100 includes an input port 102, an output port 104, a first circuit 106 and a second circuit 108. The first circuit 106 includes an input port 110 and an output port 112. The second circuit 108 includes an input port 114 and an output port 116. The input port 110 of the first circuit 106 is coupled to the input port 102 of the transmitter 100. The input port 114 of the second circuit 108 is coupled to the output port 112 of the first circuit 106. The output port 116 of the second circuit 108 is coupled to the output port 104 of the transmitter 100.

Figure 2:
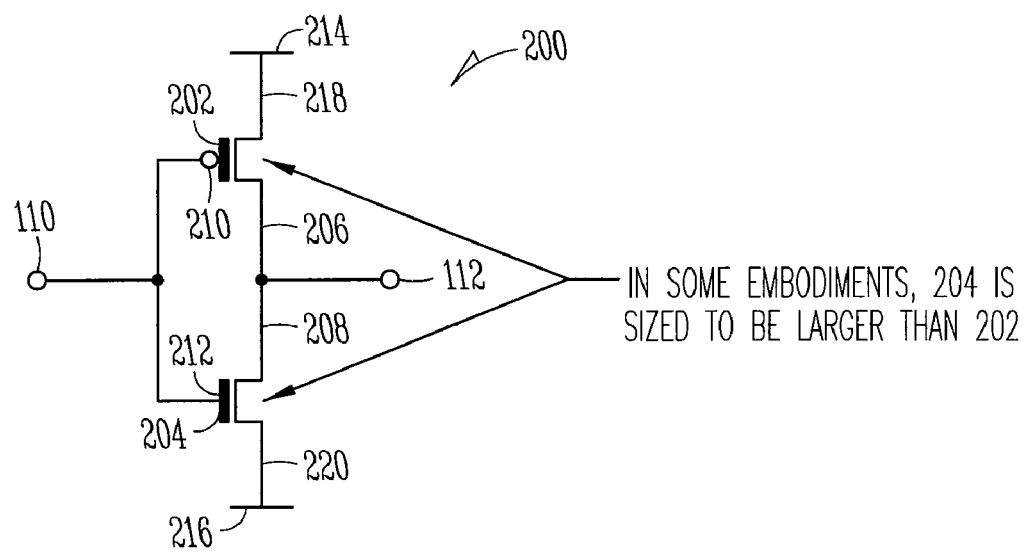
FIG. 2 is a schematic diagram of an inverter suitable for use in connection with the first circuit included in the transmitter, shown in FIG. 1, in accordance with some embodiments of the present invention.

FIG. 2 is a schematic diagram of an inverter 200 suitable for use in connection with the first circuit 106 included in the transmitter 100, shown in FIG. 1, in accordance with some embodiments of the present invention. The first circuit 106 is not limited to a particular type of circuit. In some embodiments, the first circuit 106 includes the inverter 200. The inverter 200 includes the input port 110, the output port 112, a p-type metal-oxide semiconductor field-effect transistor 202, and an n-type metal-oxide semiconductor field-effect transistor 204. The p-type metal-oxide semiconductor field-effect transistor 202 and the n-type metal oxide semiconductor field-effect transistor 204 are smaller than traditional driver circuits. Smaller circuits require less die real estate, respond faster to signal changes, generate less noise, and consume less power than larger circuits. The p-type metal-oxide semiconductor field-effect transistor 202 is connected in series with the n-type metal-oxide semiconductor field-effect transistor 204. A first metal-oxide semiconductor field-effect transistor is connected in series with a second metal-oxide semiconductor field-effect transistor when a drain/source of the first transistor is connected to a drain/source of the second transistor. A drain/source 206 of the p-type metal-oxide semiconductor field-effect transistor 202 is connected to a drain/source 208 of the n-type metal-oxide semiconductor field-effect transistor 204. A gate 210 of the p-type metal-oxide semiconductor field-effect transistor 202 is connected to the input port 110. A gate 212 of the n-type metal-oxide semiconductor field-effect transistor 204 is connected to the input port 110. Nodes 214 and 216 provide connection nodes for coupling supply potentials to the p-type metal-oxide semiconductor field-effect transistor 202 at a drain/source 218 and the n-type metal-oxide semiconductor field-effect transistor 204 at a drain/source 220, respectively.

Figure 3:
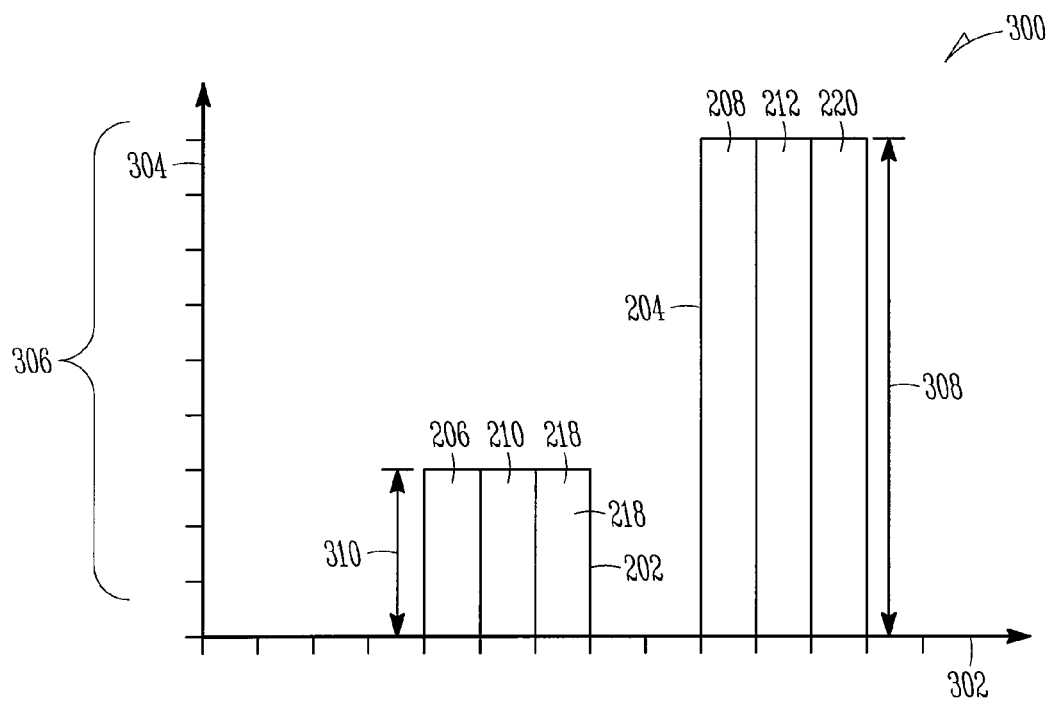
FIG. 3 is a diagram of illustrating the relative size of the p-type metal-oxide semiconductor field-effect transistor and the n-type metal-oxide semiconductor field-effect transistor, included in the inverter shown in FIG. 2, in accordance with some embodiments of the present invention.

FIG. 3 is a diagram 300 illustrating the relative size of the p-type metal-oxide semiconductor field-effect transistor 202 and the n-type metal-oxide semiconductor field-effect transistor 204, included in the inverter 200 shown in FIG. 2, in accordance with some embodiments of the present invention. Referring to FIG. 1, the first circuit 106 is sized with respect to the second circuit 108 such that for a pulse signal (shown in FIG. 4 and described below) applied at the input port 102, the transmitter 100 generates an output signal (shown in FIG. 4 and described below) having a rise-time and a fall-time that are substantially equal at the output port 104.

Referring again to FIG. 1 and FIG. 2, in some embodiments, the sizing of the first circuit 106 includes sizing the p-type metal-oxide semiconductor field-effect transistor 202 and the n-type metal-oxide semiconductor field-effect transistor 204 included in the inverter 200. In some embodiments, the n-type metal-oxide semiconductor field-effect transistor 204 is sized to be larger than the p-type metal-oxide semiconductor field-effect transistor 202. Sizing the n-type metal-oxide semiconductor field-effect transistor 204 larger than the p-type metal-oxide semiconductor 202 compensates for a slow response in the second circuit 108.

Referring again to FIG. 3, the diagram 300 includes an x-axis 302 and a y-axis 304. A physical layout illustration of the p-type metal-oxide semiconductor field-effect transistor 202 and the n-type metal-oxide semiconductor field-effect transistor 204 aligned along the x-axis is shown. The p-type metal-oxide semiconductor field-effect transistor 202 includes the gate 210, the drain/source 206, and the drain/source 218. The n-type metal-oxide semiconductor field-effect transistor 204 includes the gate 212, the drain/source 208, and the drain/source 220.

The y-axis includes length indicators 306. As can be seen in the diagram 300, the n-type metal-oxide semiconductor field-effect transistor 204 is larger than the p-type metal-oxide semiconductor field-effect transistor 202. In some embodiments, the n-type metal-oxide semiconductor field-effect transistor 204 is between about two and about three times larger than the p-type metal-oxide semiconductor field-effect transistor 202. As can be seen in the diagram 300, the length 308 of the n-type metal-oxide semiconductor field-effect transistor is about nine units, and the length 310 of the p-type metal-oxide semiconductor field-effect transistor is about three units. Sizing the n-type metal-oxide semiconductor field-effect transistor 204 at less than about two times the size of the p-type metal-oxide semiconductor field-effect transistor 202 may not provide sufficient compensation for a slow response in the second circuit 108. Sizing the n-type metal-oxide semiconductor field-effect transistor 204 at more than about three times the size of the p-type metal-oxide semiconductor field-effect transistor 202 may waste die real estate.

Figure 4:
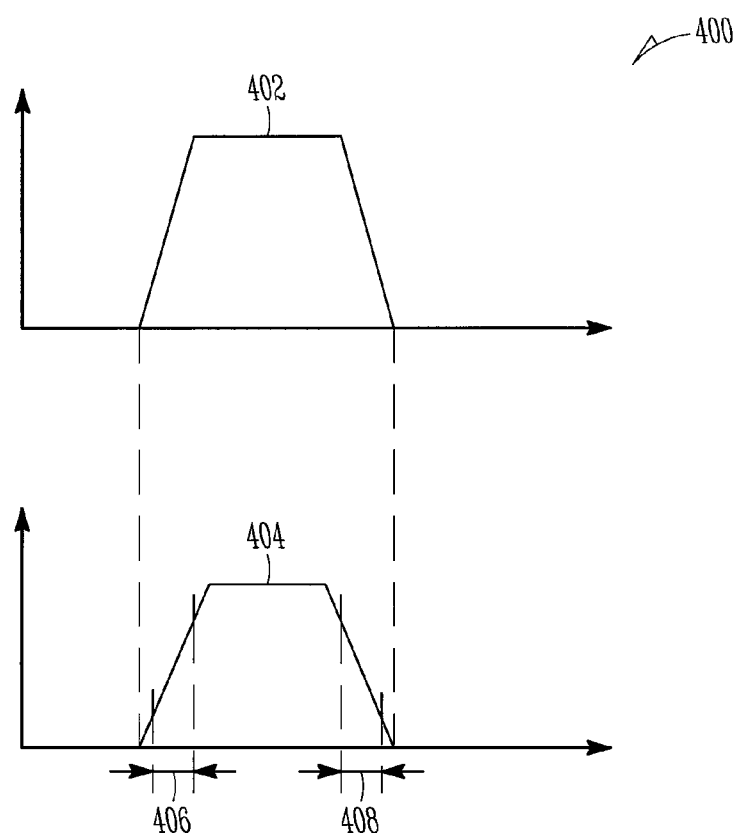
FIG. 4 is a diagram showing a pulse signal and an output signal generated in response to the pulse signal applied at the input port of the transmitter, shown in FIG. 1.

FIG. 4 is a diagram 400 showing a pulse signal 402 and an output signal 404 generated in response to the pulse signal 402 applied at the input port 102 of the transmitter 100, shown in FIG. 1. A pulse signal is a substantially symmetrical signal if the rise time of the signal is substantially equal to the fall time of the signal. The rise-time is defined as the time a signal takes to change from about 10% to about 90% of a final value. The fall-time is defined as the time the signal takes to change from about 90% to about 10% of a final value. In some embodiments, the pulse signal 402 is a substantially symmetrical signal. The output signal 404 includes a rise-time 406 and a fall time 408. As can be seen in the diagram 400, the rise-time 406 of the output signal 404 is substantially equal to the fall-time 408 of the output signal 404.

Figure 5:
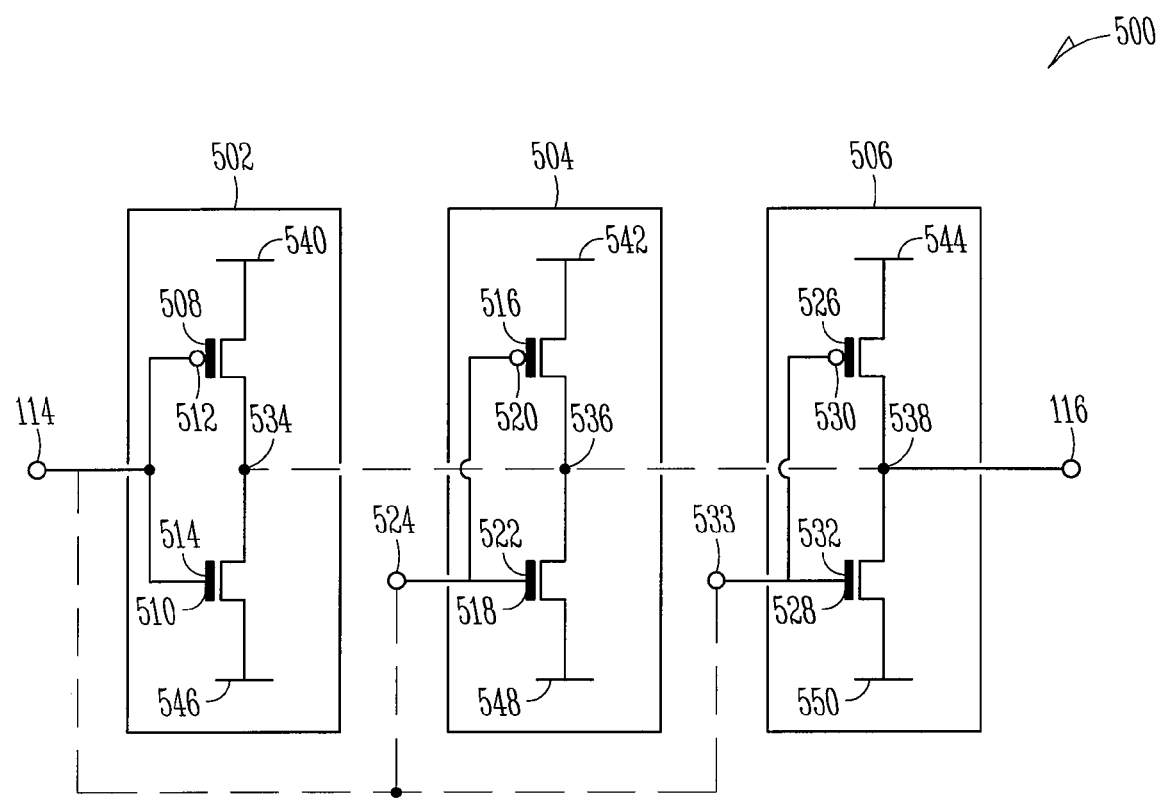
FIG. 5 is a schematic diagram of a plurality of driver circuits suitable for use in connection with the second circuit included in the transmitter, shown in FIG. 1, in accordance with some embodiments of the present invention.

FIG. 5 is a schematic diagram of a plurality of driver circuits 500 suitable for use in connection with the second circuit 108 included in the transmitter 100, shown in FIG. 1, in accordance with some embodiments of the present invention. The second circuit 108 is not limited to a particular type of circuit. In some embodiments, the second circuit 108 includes the plurality of driver circuits 500. The plurality of driver circuits 500 include the input port 114, the output port 116, and driver circuits 502, 504, and 506. Each of the plurality of driver circuits 502, 504, and 506 includes a p-type metal-oxide semiconductor field-effect transistor connected in series with an n-type metal-oxide semiconductor field-effect transistor. The driver circuit 502 includes a p-type metal-oxide semiconductor field-effect transistor 508 connected in series with an n-type metal-oxide semiconductor field-effect transistor 510. Gates 512 and 514 are connected together and to the input port 114 of the second circuit 108. The driver circuit 504 includes a p-type metal-oxide semiconductor field-effect transistor 516 connected in series with an n-type metal-oxide semiconductor field-effect transistor 518. Gates 520 and 522 are connected together and to a node 524. The driver circuit 506 includes a p-type metal-oxide semiconductor field-effect transistor 526 connected in series with an n-type metal-oxide semiconductor field-effect transistor 528. Gates 530 and 532 are connected together and to a node 533. Each of the plurality of driver circuits 502, 504, and 506 can be made smaller than traditional driver circuits. Smaller circuits require less die real estate, respond faster to signal changes, generate less noise, and consume less power than larger circuits.

Each of the plurality of driver circuits 502, 504, and 506 includes an output port 534, 536, and 538, respectively. The output ports 534, 536, and 538 are shown in FIG. 5 as connected to the output port 116 through dotted lines. Those skilled in the art will appreciate that, in some embodiments, one or more equalization control circuits (not shown) can be added between output ports 534, 536, and 538 to provide equalization. The nodes 524 and 533 are also connected to the input port 114 through dotted lines. Those skilled in the art will appreciate that, in some embodiments, one or more equalization control circuits (not shown) can be added between the nodes 524 and 533 to provide equalization.

In some embodiments, each of the plurality of driver circuits 502, 504, and 506 is sized by sizing the p-type metal-oxide semiconductor field-effect transistors 508, 516, and 526 to source a first current and by sizing the n-type metal-oxide semiconductor field effect transistors 510, 518, and 528 to sink a second current substantially equal to the first current. Nodes 540, 542, 544, 546, 548, and 550 provide connection nodes for coupling supply potentials to the each of the plurality of driver circuits 502, 504, and 506.

Figure 6:
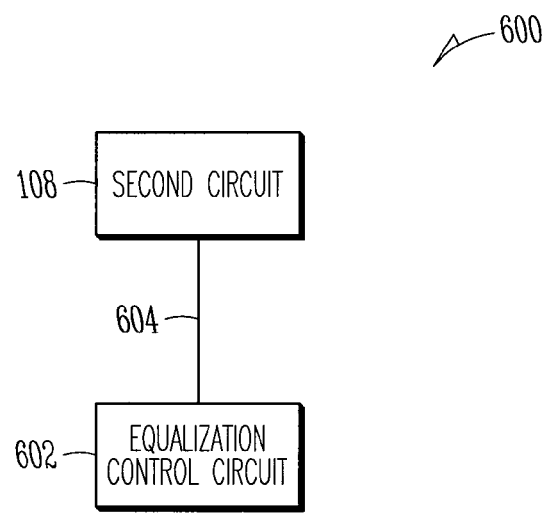
FIG. 6 is a block diagram of the second circuit, shown in FIG. 1, connected to an equalization control circuit in accordance with some embodiments of the present invention.

FIG. 6 is a block diagram 600 of the second circuit 108, shown in FIG. 1, connected to an equalization control circuit 602 in accordance with some embodiments of the present invention. The equalization control circuit 602 provides control signals to the second circuit 108. For example, for the plurality of driver circuits 500, shown in FIG. 5, the equalization control circuit 602 provides one or more control signals (not shown) over a connection 604 to the nodes 524 and 533 to add or remove one or more of the plurality of driver circuits 504 and 506. In some embodiments, the equalization control circuit 602 provides de-emphasis. The equalization control circuit 602 provides de-emphasis with respect to the plurality of driver circuits 500 by enabling fewer than all the plurality of driver circuits 504 and 506.

Figure 7:
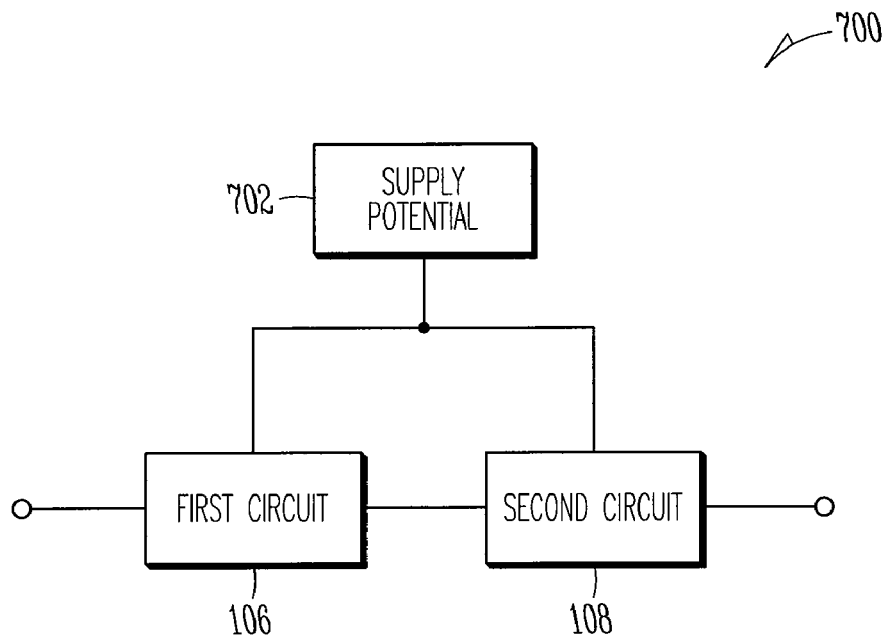
FIG. 7 is a block diagram of a supply potential coupled to the first circuit, shown in FIG. 1, and the second circuit, also shown in FIG. 1 in accordance with some embodiments of the present invention.

FIG. 7 is a block diagram 700 showing a supply potential 702 coupled to the first circuit 106, shown in FIG. 1, and the second circuit 108, also shown in FIG. 1 in accordance with some embodiments of the present invention. Referring to FIG. 1, in some embodiments, the transmitter 100 produces a signal (not shown) having a particular signal level at the output port 104.

Figure 8:
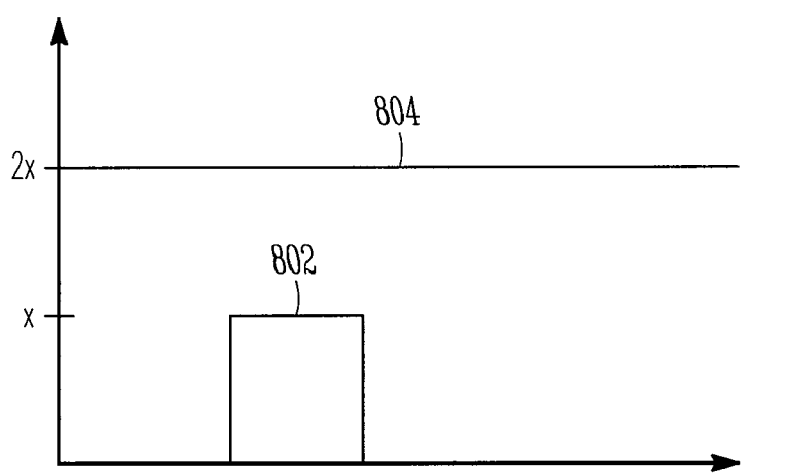
FIG. 8 is a diagram showing a signal having a particular signal level x and a supply potential having a signal level 2x in accordance with some embodiments of the present invention.

FIG. 8 is a diagram 800 showing a signal 802 having a particular signal level x and the supply potential 702 having a signal level 804 of 2x in accordance with some embodiments of the present invention. In some embodiments, the supply potential 702 (shown in FIG. 7) has a value of about twice the value of a signal 802 provided at the output port 104 (shown in FIG. 1).

Figure 9:
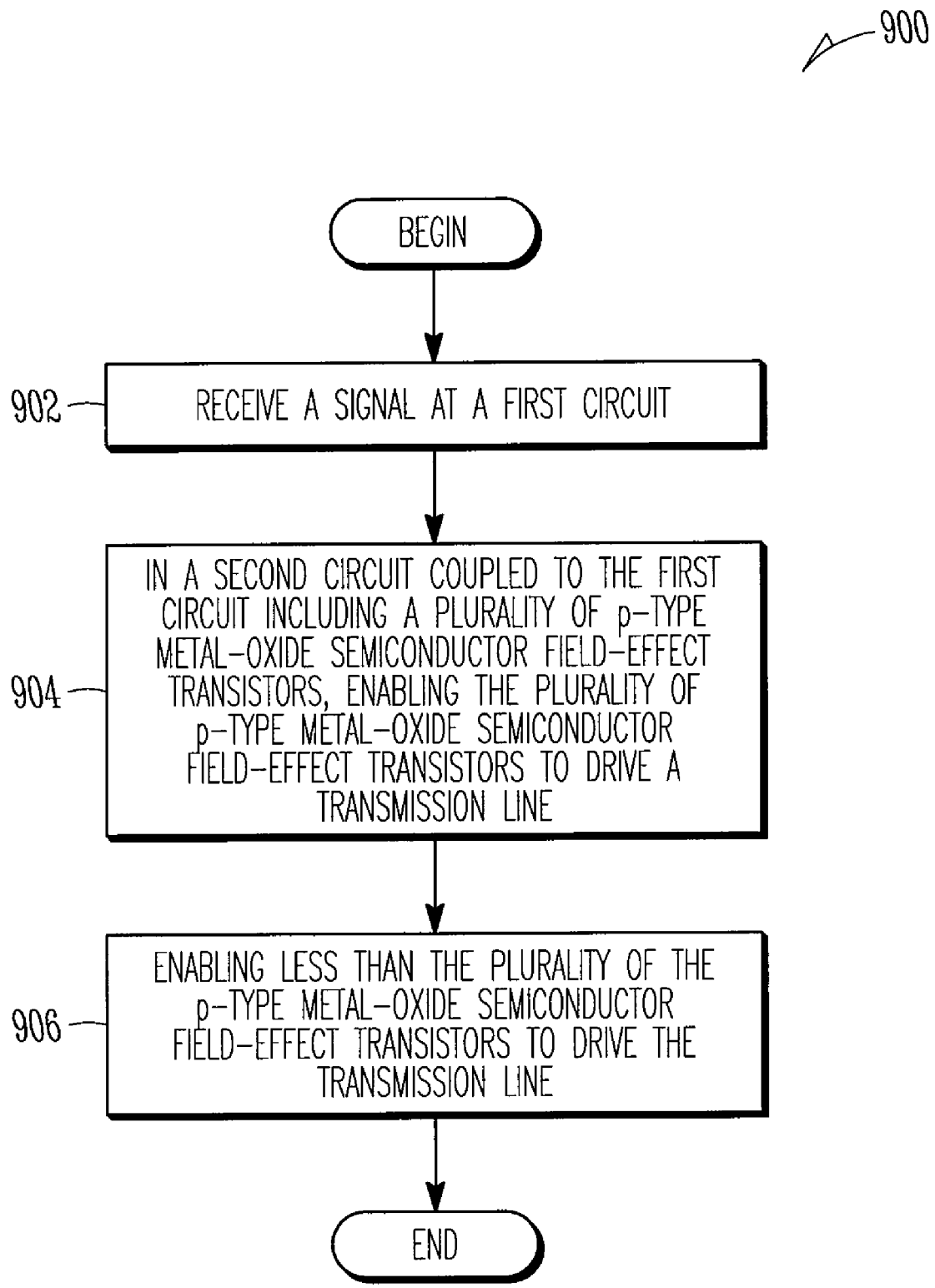
FIG. 9 is a flow diagram of a method in accordance with some embodiments of the present invention.

FIG. 9 is a flow diagram of a method 900 in accordance with some embodiments of the present invention. The method 900 includes receiving a signal at a first circuit (block 902), in a second circuit coupled to the first circuit, the second circuit including a plurality of p-type metal-oxide semiconductor field-effect transistors, enabling the plurality of p-type metal-oxide semiconductor field-effect transistors to drive a transmission line (block 904), and enabling less than the plurality of the p-type metal-oxide semiconductor field-effect transistors to drive the transmission line (block 906). In alternate embodiments, receiving a signal at a first circuit includes receiving a digital signal. In another alternate embodiment, enabling the plurality of p-type metal-oxide semiconductor field-effect transistors to drive a transmission line includes enabling the plurality of p-type metal-oxide semiconductor field-effect transistors substantially simultaneously. In still another alternate embodiment, the enabling less than all of the p-type metal-oxide semiconductor field-effect transistors to drive the transmission line comprises enabling less than all of the p-type metal-oxide semiconductor field-effect transistors substantially simultaneously.

Figure 10:
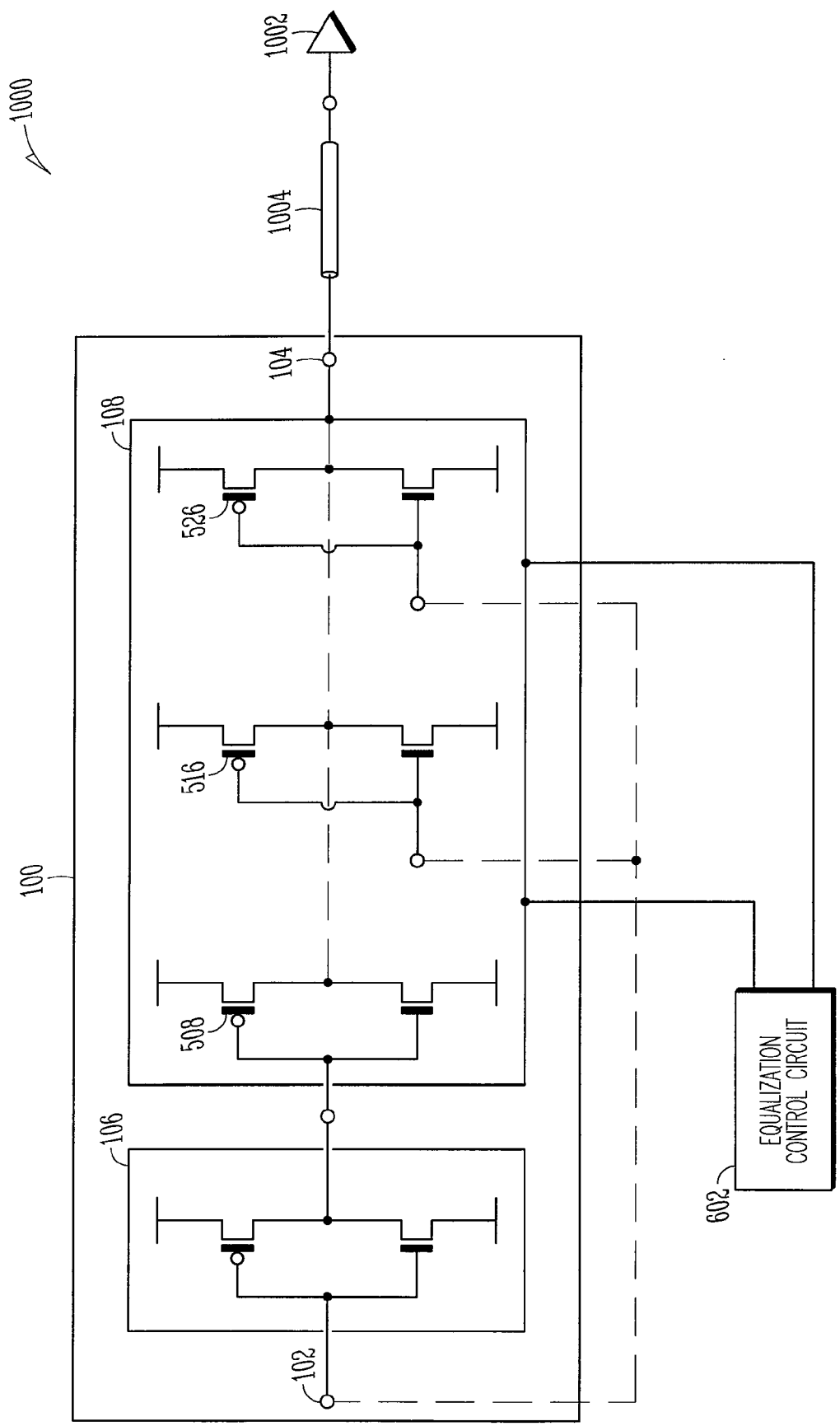
FIG. 10 is a block diagram of a system including the transmitter, shown in FIG. 1, the equalization control circuit, shown in FIG. 6, a receiver, and a transmission line in accordance with some embodiments of the present invention.

FIG. 10 is a block diagram of a system 1000 including the transmitter 100, shown in FIG. 1, the equalization control circuit 602, shown in FIG. 6, a receiver 1002, and a transmission line 1004 in accordance with some embodiments of the present invention. The transmitter 100 includes the first circuit 106 and the second circuit 108. The first circuit 106 is coupled to the input port 102 of the transmitter 100. The second circuit 108 couples the first circuit 106 to the output port 104 of the transmitter 100. The transmission line 1004 couples the output port 104 of the transmitter 100 to the receiver 1002. The system 1000 is not limited to use in connection with a particular type of transmission line. Exemplary transmission lines suitable for use in connection with the system 100 include coaxial cable, stripline, and micro-stripline. In some embodiments, the second circuit 108 includes a voltage driver. A voltage driver is a circuit that provides a substantially constant voltage independent of the current demand. In addition, a voltage driver consumes less power than a current driver. In some embodiments, the second circuit includes a controllable source impedance. A controllable source impedance is an impedance that includes one or more impedance elements, such as metal-oxide semiconductor field-effect transistors, that can be selectively turned on and off. The second circuit 108 includes a controllable source impedance. Each of the p-type metal-oxide semiconductor field-effect transistors 508, 516, and 526 (also shown in FIG. 5 and described above) provide a controllable source impedance in the transmitter 100. Each of the p-type metal-oxide semiconductor field-effect transistors 516 and 526 can be selectively added to the second circuit 108 under control of the equalization control circuit 602. As circuitry for selectively adding circuits is known to those skilled in the art, such circuits are not shown in FIG. 10.

Figure 11:
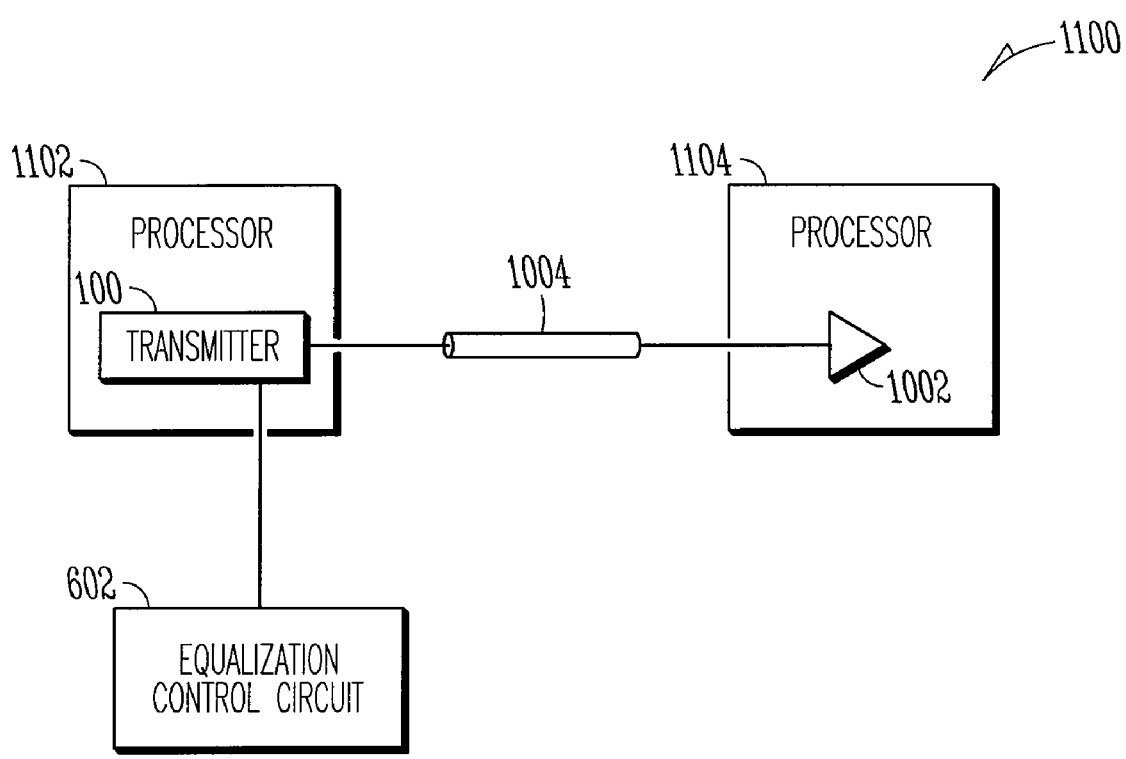
FIG. 11 is a block diagram of a system including a first processor, a second processor, the transmitter, shown in FIG. 1, the transmission line, shown in FIG. 10, the receiver, shown in FIG. 10, and the equalization control circuit, shown in FIG. 6.

FIG. 11 is a block diagram of a system 1100 including a first processor 1102, a second processor 1104, the transmitter 100, shown in FIG. 1, the transmission line 1004, shown in FIG. 10, the receiver 1002, shown in FIG. 10, and the equalization control circuit 602, shown in FIG. 6. The first processor 1102 includes the transmitter 100. The second processor 1104 includes the receiver 1002 (shown in FIG. 10). The receiver 1002 is coupled to the transmitter 100 through the transmission line 1004. In some embodiments, the first processor includes a very long instruction word processor. In some embodiments, the second processor includes a complex instruction set processor. The equalization control circuit 602, (shown in FIG. 6 and described above) is coupled to the transmitter 100.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A transmitter comprising:
a first circuit coupled to an input port of the transmitter, the first circuit including an input port and an output port and an inverter including no more than two transistors including a first transistor and a second transistor, the first transistor having a source/drain directly connected to a source drain of the second transistor and a first gate of the first transistor and a second gate of the second transistor both coupled directly to the input port of the transmitter,
wherein the first transistor and the second transistor of the inverter include a n-type metal-oxide semiconductor field-effect transistor connected in series with an p-type metal-oxide semiconductor field-effect transistor and wherein the n-type metal-oxide semiconductor field-effect transistor is between about two and about three times larger than the p-type metal-oxide semiconductor field-effect transistor; and
a second circuit including a second circuit input port coupled to the output port of the first circuit, the second circuit including a second circuit output port coupled to an output port of the transmitter, wherein the first circuit is sized with respect to the second circuit such that for a pulse signal applied to the input port of the transmitter, the transmitter generates an output signal having a rise-time and a fall-time that are substantially equal at the output port of the transmitter,
wherein the transmitter is operable to transmit at a signal level, and the first circuit and the second circuit are coupled to a supply potential having a value of about twice the signal level.

2. The transmitter of claim 1, wherein the second circuit includes a plurality of driver circuits.

3. The transmitter of claim 2, wherein each of the plurality of driver circuits includes a p-type metal-oxide semiconductor field-effect transistor connected in series with an n-type metal-oxide semiconductor field-effect transistor.

4. The transmitter of claim 3, wherein the p-type metal-oxide semiconductor field-effect transistor is sized to source a first current and the n-type metal-oxide semiconductor field effect transistor is sized to sink a second current substantially equal to the first current.

5. The transmitter of claim 3, wherein the second circuit is connected to an equalization control circuit.

6. The transmitter of claim 5, wherein the equalization control circuit provides de-emphasis.

7. A transmitter comprising:
a first circuit coupled to an input port of the transmitter, the first circuit including an input port and an output port and no more than two transistors including a first transistor and a second transistor, the first transistor having a source/drain directly connected to a source drain of the second transistor, the second transistor larger than the first transistor; and
a second circuit including a second circuit input port coupled to the output port of the first circuit, the second circuit including a second circuit output port coupled to an output port of the transmitter, wherein the first circuit is sized with respect to the second circuit such that for a pulse signal applied to the input port of the transmitter, the transmitter generates an output signal having a rise-time and a fall-time that are substantially equal at the output port of the transmitter,
wherein the transmitter transmits at a signal level and the first circuit and the second circuit are coupled to a supply potential having a value of about twice the signal level.

8. A method comprising:
receiving a signal at a first circuit, the first circuit including an input port and an output port and no more than two transistors including a first transistor and a second transistor, the first transistor having a source/drain directly connected to a source drain of the second transistor, a first gate of the first transistor and a second gate of the second transistor both coupled directly to the input port of the transmitter, the second transistor larger than the first transistor;
in a second circuit coupled to the first circuit, the second circuit including a plurality of p-type metal-oxide semiconductor field-effect transistors, enabling the plurality of p-type metal-oxide semiconductor field-effect transistors to drive a transmission line; and
enabling less than the plurality of the p-type metal-oxide semiconductor field-effect transistors to drive the transmission line,
wherein the first circuit is sized with respect to the second circuit such that for a pulse signal applied to the input port of the first circuit, the transmitter generates an output signal having a rise-time and a fall-time that are substantially equal at an output port of the transmitter,
wherein the output signal has a signal level, and the first circuit and the second circuit are coupled to a supply potential having a value of about twice the signal level.

9. The method of claim 8, wherein receiving a signal at a first circuit includes receiving a digital signal.

10. The method of claim 9, wherein enabling the plurality of p-type metal-oxide semiconductor field-effect transistors to drive a transmission line includes enabling the plurality of p-type metal-oxide semiconductor field-effect transistors substantially simultaneously.

11. The method of claim 10, wherein enabling less than all of the p-type metal-oxide semiconductor field-effect transistors to drive the transmission line comprises enabling less than all of the p-type metal-oxide semiconductor field-effect transistors substantially simultaneously.

12. A system comprising:
a transmitter including:
a first circuit coupled to an input port of the transmitter, the first circuit including an input port and an output port and no more than two transistors including a first transistor and a second transistor, the first transistor having a source/drain directly connected to a source drain of the second transistor, the second transistor larger than the first transistor; and
a second circuit to couple the first circuit to an output port of the transmitter, the second circuit coupled to an equalization control circuit, wherein the equalization control circuit provides de-emphasis;
a receiver; and
a transmission line to couple the output port of the transmitter to the receiver,
wherein the transmitter transmits at a signal level and the first circuit and the second circuit are coupled to a supply potential having a value of about twice the signal level.

13. The system of claim 12, wherein the first circuit including an inverter having a p-type metal-oxide semiconductor field-effect transistor and an n-type metal oxide semiconductor field-effect transistor, the n-type metal-oxide semiconductor field-effect transistor being between about two and about three times larger than the p-type metal oxide semiconductor field-effect transistor.

14. The system of claim 13, wherein the second circuit includes a voltage driver.

15. The system of claim 14, wherein the second circuit includes a controllable source impedance.

16. A system comprising:
a first processor including a transmitter comprising:
a first circuit including a single and no more than one input port coupled to an input port of the transmitter and a single and no more than one output port,
wherein the first circuit includes an inverter including no more than two transistors including a n-type metal-oxide semiconductor field-effect transistor connected in series with an p-type metal-oxide semiconductor field-effect transistor, a first gate of the a n-type metal-oxide semiconductor field-effect transistor and a second gate of the p-type metal-oxide semiconductor field-effect transistor both coupled directly to the input port of the transmitter, and wherein the n-type metal-oxide semiconductor field-effect transistor is between about two and about three times larger than the p-type metal-oxide semiconductor field-effect transistor; and
a second circuit including a single and no more than one second circuit input port directly coupled only to the single and no more than one output port of the first circuit, the second circuit including a second circuit output port coupled to an output port of the transmitter, wherein the first circuit is sized with respect to the second circuit such that for a pulse signal applied to the input port, the transmitter generates an output signal having a rise-time and a fall-time that are substantially equal at the output port; and
a second processor including a receiver coupled to the transmitter through a transmission line,
wherein the transmitter is operable to transmit at a signal level, and the first circuit and the second circuit are coupled to a supply potential having a value of about twice the signal level.

17. The system of claim 16, wherein the first processor includes a very long instruction word processor.

18. The system of claim 17, wherein the second processor includes a complex instruction set processor.

19. The system of claim 18, further comprising an equalization control circuit coupled to the second circuit to provide de-emphasis equalization.

20. The transmitter of claim 7, wherein the first circuit includes an inverter.

21. The transmitter of claim 20, wherein the inverter includes a n-type metal-oxide semiconductor field-effect transistor connected in series with an p-type metal-oxide semiconductor field-effect transistor.

22. The transmitter of claim 21, wherein the n-type metal-oxide semiconductor field-effect transistor is larger than the p-type metal-oxide semiconductor field-effect transistor.

* * * * *